(12) United States Patent
Srivastava et al.

(10) Patent No.: US 11,851,759 B2
(45) Date of Patent: *Dec. 26, 2023

(54) FACEPLATE HAVING A CURVED SURFACE

(71) Applicant: Applied Materials, Inc., Santa Clara, CA (US)

(72) Inventors: Shailendra Srivastava, Fremont, CA (US); Sai Susmita Addepalli, San Jose, CA (US); Nikhil Sudhindrarao Jorapur, Sunnyvale, CA (US); Daemian Raj Benjamin Raj, Fremont, CA (US); Amit Kumar Bansal, Milpitas, CA (US); Juan Carlos Rocha-Alvarez, San Carlos, CA (US); Gregory Eugene Chichkanoff, Mountain View, CA (US); Xinhai Han, Santa Clara, CA (US); Masaki Ogata, San Jose, CA (US); Kristopher Enslow, San Jose, CA (US); Wenjiao Wang, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/083,173

(22) Filed: Dec. 16, 2022

(65) Prior Publication Data
US 2023/0123089 A1 Apr. 20, 2023

Related U.S. Application Data

(63) Continuation of application No. 16/894,355, filed on Jun. 5, 2020, now Pat. No. 11,530,482.

(Continued)

(51) Int. Cl.
*C23C 16/455* (2006.01)
*H01J 37/32* (2006.01)
(Continued)

(52) U.S. Cl.
CPC .... *C23C 16/45565* (2013.01); *C23C 16/4583* (2013.01); *C23C 16/45536* (2013.01);
(Continued)

(58) Field of Classification Search
CPC .............. C23C 16/50; C23C 16/45536; C23C 16/45565; C23C 16/5096; C23C 16/4583;
(Continued)

(56) References Cited

U.S. PATENT DOCUMENTS 6,302,965 B1 * 10/2001 Umotoy ............ C23C 16/45576
118/715
2003/0089314 A1 5/2003 Matsuki et al.
(Continued)

FOREIGN PATENT DOCUMENTS

CN 101319309 A 12/2008
CN 102017813 A 4/2011
(Continued)

OTHER PUBLICATIONS

JP Office Action for Japanese Application No. 2021-572416 dated Jan. 31, 2023.
(Continued)

*Primary Examiner* — Yuechuan Yu
(74) *Attorney, Agent, or Firm* — PATTERSON + SHERIDAN, LLP

(57) ABSTRACT

A faceplate for a substrate process chamber comprises a first and second surface. The second surface is shaped such that the second surface includes a peak and a distance between the first and second surface varies across the width of the faceplate. The second surface of the faceplate is exposed to a processing volume of the process chamber. Further, the faceplate may be part of a lid assembly for the process chamber. The lid assembly may include a blocker plate
(Continued)

facing the first surface of the faceplate. A distance between the blocker plate and the first surface is constant.

16 Claims, 5 Drawing Sheets

Related U.S. Application Data

(60) Provisional application No. 62/858,772, filed on Jun. 7, 2019.

(51) Int. Cl.
  *C23C 16/50* (2006.01)
  *C23C 16/458* (2006.01)
(52) U.S. Cl.
  CPC .......... *C23C 16/50* (2013.01); *H01J 37/3244* (2013.01); *H01J 37/32458* (2013.01); *H01J 2237/3321* (2013.01)
(58) Field of Classification Search
  CPC ............ H01J 37/32458; H01J 37/3244; H01J 2237/3321
  See application file for complete search history.

(56) References Cited

U.S. PATENT DOCUMENTS

| | | |
|---|---|---|
| 2003/0173030 A1 | 9/2003 | Ishii et al. |
| 2004/0060514 A1 | 4/2004 | Janakiraman et al. |
| 2008/0302303 A1* | 12/2008 | Choi ................. C23C 16/45565 438/758 |
| 2009/0269512 A1* | 10/2009 | Zhou ................... C23C 16/5096 427/569 |
| 2012/0103264 A1 | 5/2012 | Choi et al. |
| 2015/0247237 A1* | 9/2015 | Ha .................... H01J 37/32449 118/715 |
| 2018/0090300 A1 | 3/2018 | Zhao et al. |
| 2018/0135173 A1 | 5/2018 | Kim et al. |
| 2018/0148841 A1 | 5/2018 | Lee et al. |

FOREIGN PATENT DOCUMENTS

| | | |
|---|---|---|
| JP | 2000-269146 | 9/2000 |
| JP | 2010529682 | 8/2010 |
| JP | 2011518959 A | 6/2011 |
| WO | 2019033052 A1 | 2/2019 |

OTHER PUBLICATIONS

CN Office Action for Chinese Application No. 202080040862.0 dated Jun. 20, 2023.
JP Office Action for Japanese Application No. 2021-572416 dated Aug. 1, 2023.

* cited by examiner

FACEPLATE HAVING A CURVED SURFACE

CROSS-REFERENCE TO RELATED APPLICATIONS

This application is a continuation application of U.S. patent application Ser. No. 16/894,355, filed Jun. 5, 2020, which claims priority to and the benefit of U.S. Provisional Patent Application Ser. No. 62/858,772, filed Jun. 7, 2019, each of which is incorporated herein by reference in its entirety.

BACKGROUND

Field

Embodiments of the present disclosure generally relate to a faceplates of process chambers, and specifically to faceplates having a curved surface.

Description of the Related Art

Many semiconductor devices are commonly created by forming multiple layers of different materials on the surface of a substrate. In many instances, the semiconductor devices include stacks of multiple tiers, or steps, of layers of different materials. For example, in a 3D NAND memory, multiple tiers of oxide and nitride layers are vertically stacked to form the memory device. During processing, each layer that is deposited experiences localized stress non-uniformity quantified by in-plane distortion (IPD). The localized stress non-uniformity may be due to non-uniformities within the plasma during the deposition process. For example, the density of the plasma may not be uniform across the surface of a substrate. Further, in various instances radio frequency (RF) signals having increased frequencies (e.g., 27 MHz or higher) have been utilized to increase the deposition rate. However, utilizing RF signals having increased frequencies increases the plasma non-uniformity. Accordingly, the localized stress non-uniformity of the layers is also increased, increasing the production failure rate. Additionally, as the number of layers increases, the cumulative localized stress non-uniformity of each layer increases. Thus, the production failure rate in semiconductor devices having a high number of layers is increased.

Thus, there is a need for an improved process chamber for reducing localized stress non-uniformity of the layers deposited on a substrate.

SUMMARY

In one example, a faceplate for a process chamber comprises a circular mounting ring configured to mount the faceplate within the process chamber. The faceplate further comprises a plurality of apertures, a first surface, and a second surface. The second surface is opposite the first surface and is configured to be exposed to a processing volume of the process chamber. Further, the second surface includes a first peak. Additionally, a distance between the first surface and the second surface varies. Further, the faceplate is comprised of a conductive material.

In one example, a lid assembly for a process chamber comprises a gas box, a gas conduit, a blocker plate and a faceplate. The gas conduit passes through the gas box. The blocker plate is coupled to the gas box. The faceplate comprises a circular mounting ring configured to mount the faceplate within the process chamber. The faceplate further comprises a plurality of apertures, a first surface, and a second surface. The second surface is opposite the first surface and is configured to be exposed to a processing volume of the process chamber. Further, the second surface includes a first peak. Additionally, a distance between the first surface and the second surface varies. Further, the faceplate is comprised of a conductive material.

In one example, a process chamber comprises a substrate support assembly, a chamber wall, and a lid assembly. The substrate support assembly is disposed within a processing volume of the process chamber. The lid assembly is coupled to the chamber wall and comprises a blocker plate and a faceplate. The faceplate is coupled to the blocker plate. The faceplate comprises a circular mounting ring configured to mount the faceplate within the process chamber. The faceplate further comprises a plurality of apertures, a first surface, and a second surface. The second surface is opposite the first surface and is configured to be exposed to a processing volume of the process chamber. Further, the second surface includes a first peak. Additionally, a distance between the first surface and the second surface varies. Further, the faceplate is comprised of a conductive material.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

Figure 1:
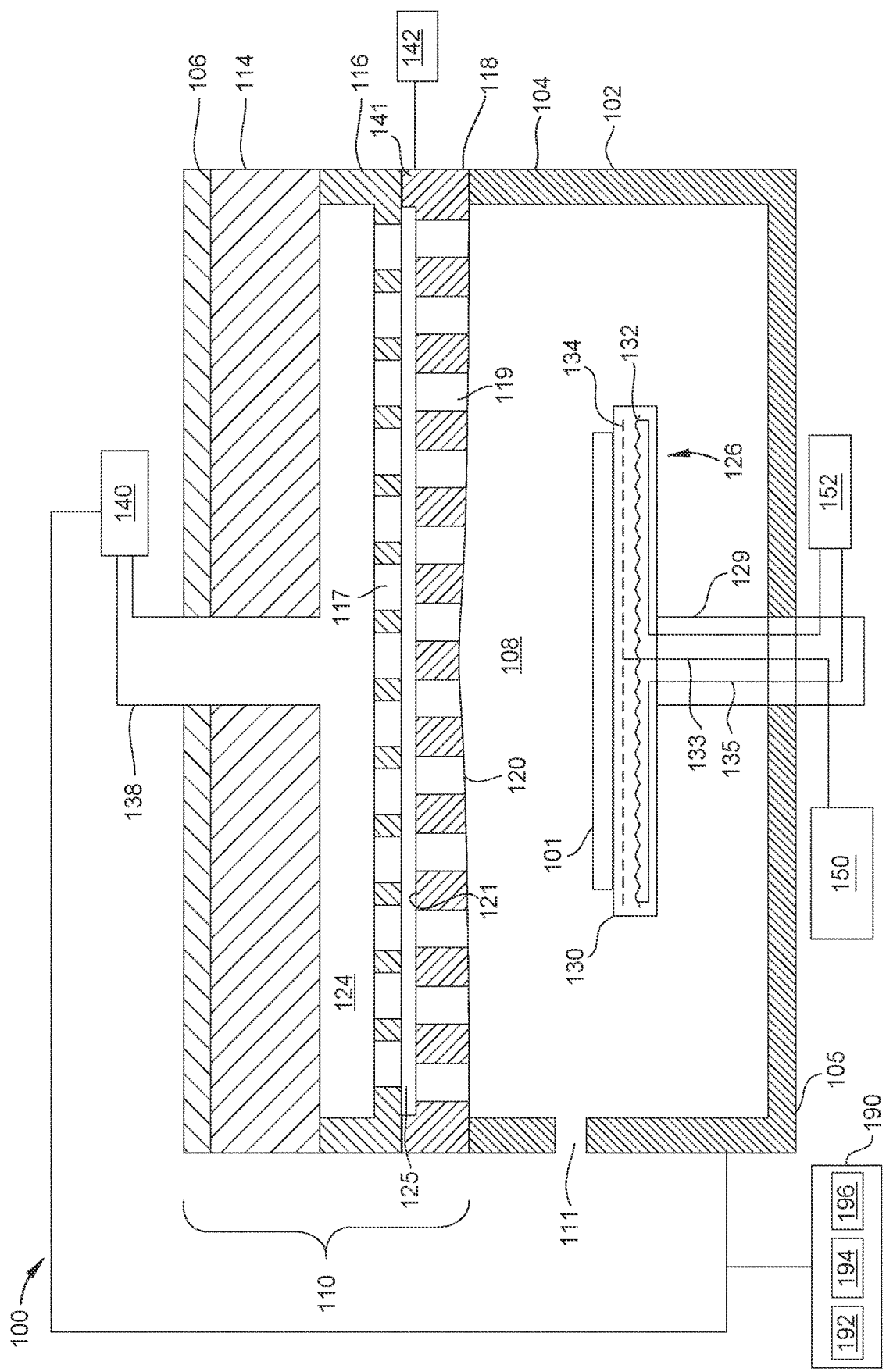
FIG. 1 is a schematic illustration of a process chamber, according to one or more embodiments.

To facilitate understanding, identical reference numerals have been used, where possible, to designate identical elements that are common to the figures. It is contemplated that elements disclosed in one embodiment may be beneficially utilized in other embodiments without specific recitation thereof with respect thereto.

DETAILED DESCRIPTION

Multiple layers of different materials may be deposited on a substrate to generate various different semiconductor devices. Each individual layer may have relatively small localized stress non-uniformity; however, each layer experiences a cumulative localized stress non-uniformity compounding the effects for each layer. The localized stress non-uniformity is quantized as in-plane distortion (IPD) and corresponds to plasma non-uniformity within the processing volume of a process chamber. Further, the deposition of these layers is a time consuming process. However, when higher frequencies are used (e.g., greater than 27 MHz) for higher throughput, the plasma non-uniformity resulting from the higher frequencies adds to the localized stress non-uniformity. However, by varying the shape of at least one of the electrodes used to generate the plasma within the processing volume, the plasma non-uniformity may be decreased, reducing the localized stress non-uniformity of each layer.

FIG. 1 illustrates a process chamber 100, according to one or more embodiments. The process chamber 100 includes a chamber body 102 having sidewalls 104, a bottom 105, and a lid assembly 110. The sidewalls 104 and faceplate 118 of the lid assembly 110 define a processing volume 108. A substrate transfer port 111 may be formed in the sidewall 104 for transferring substrates into and out of the processing volume 108. The process chamber 100 may be of one a chemical vapor deposition (CVD) process chamber, an atomic layer deposition (ALD) process chamber, a metalorganic chemical vapor deposition (MOCVD) process chamber, a plasma-enhanced chemical vapor deposition (PECVD) process chamber, and a plasma-enhanced atomic layer deposition (PEALD) process chamber, among others.

A substrate support assembly 126 is disposed within the processing volume 108 of the process chamber 100 below the lid assembly 110. The substrate support assembly 126 is configured to support a substrate 101 during processing. The substrate 101 may have a circular circumference. The substrate support assembly 126 may include a plurality of lift pins (not shown) movably disposed therethrough. The lift pins may be actuated to project from a surface 130 of the substrate support assembly 126, thereby placing the substrate 101 in a spaced-apart relation to the substrate support assembly 126 to facilitate transfer with a transfer robot (not shown) through the substrate transfer port 111. The substrate support assembly 126 is coupled to the shaft 129 to facilitate vertical actuation and/or rotation of the substrate support assembly 126.

An electrode 134 is part of the substrate support assembly 126. The electrode 134 is embedded within the substrate support assembly 126 or coupled to the surface 130 of the substrate support assembly 126. The electrode 134 may be a plate, a perforated plate, a mesh, a wire screen, or any other distributed arrangement. The electrode 134 is a tuning electrode, and is coupled to a power supply 150 by a conduit 133 disposed in the shaft 129 of the substrate support assembly 126.

An electrode 132, which may be a bias electrode and/or an electrostatic chucking electrode, may be part of the substrate support assembly 126. The electrode 132 may be coupled to a power supply 152 via conduit 135. The power supply 152 may be direct current (DC) power, pulsed DC power, radio frequency (RF) power, pulsed RF power, or a combination thereof.

The lid assembly 110 includes a lid 106, a gas box 114, a blocker plate 116, and a faceplate 118. A plenum 124 is formed between the gas box 114 and the blocker plate 116. Further, a plenum 125 is formed between the blocker plate 116 and the faceplate 118. The blocker plate 116 includes apertures 117 and the faceplate 118 includes apertures 119 through which processing gases flow into the processing volume 108. The plurality of apertures 117 of the blocker plate 116 allows for fluid distribution between the plenum 124 and the plenum 125. The blocker plate 116 is configured to disperse the gas mixture from center to edge before it is introduced to the plenum 125. The plenum 125 enables gas mixture transfer to a processing volume 108 defined between the faceplate 118 and the substrate support assembly 126 through a plurality of apertures 119 formed through the faceplate 118. Further, the gas mixture is ionized to form plasma in the processing volume 108.

The process chamber 100 further includes a central conduit 138. The central conduit 138 passes through the gas box 114. For example, the central conduit 138 is formed through the lid 106 and the gas box 114 and opens into the plenum 124. The central conduit 138 is configured to provide one or more process gases to the plenum 124 from the gas supply system 140.

The faceplate 118 may be comprised of a conductive material. For example, the faceplate 118 may be comprised of aluminum. Additionally, or alternatively, the faceplate 118 may be comprised of other conductive materials. The faceplate 118 includes a mounting ring 141. The mounting ring 141 is circular and positioned around the circumference of the faceplate 118. Further, the mounting ring 141 may be used to mount the faceplate 118 within the lid assembly 110. For example, the mounting ring 141 may be coupled to the blocker plate 116, or another element of the lid assembly 110.

The faceplate 118 may be coupled to a power supply 142. The power supply 142 may be an RF generator and may be configured to generate DC power, pulsed DC power, and pulsed RF power. For example, the power supply 142 may drive the faceplate 118 with RF power having a frequency in a range of about 13 MHz to about 60 MHz. Alternatively, frequencies lower than 13 MHz and greater than 60 MHz may be utilized.

The faceplate 118 has surface 120 and surface 121. The surface 120 may be curved (e.g., Gaussian or bell-shaped as in the embodiment of FIG. 1) such that a distance between the surface 121 and the substrate support assembly 126 varies across the width of the faceplate 118. Further, the distance between surface 120 and 121 vary across the width of the faceplate 118 and from a center to an edge of the faceplate 118. Additionally, the distance between the surface 120 and the blocker plate 116 varies across width of the faceplate 118 and the distance between the surface 121 and the blocker plate 116 is constant across the width of the faceplate 118.

The surface 121 faces the blocker plate 116. The surface 121 may be substantially parallel to an adjacent surface of the blocker plate 116 such that the distance between the surface 121 and the blocker plate 116 is substantially constant across the width of the faceplate 118. In such an example, the surface 121 is planar.

The surface 120 faces and is exposed to the processing volume 108. For example, the processing volume 108 is formed between the surface 120 of the faceplate 118 and the surface 130 of the substrate support assembly 126.

Varying the shape of the surface 120 of the faceplate 118 adjusts the plasma non-uniformity within the processing volume 108, adjusting the localized stress non-uniformity of the layers deposited on the substrate 101. For example, shaping the surface 121 so that the surface 121 is curved decreases the plasma non-uniformity within the processing volume 108. Further, decreasing the plasma non-uniformity decreases the localized stress non-uniformity of the layers deposited on the substrate 101. Decreasing the localized stress non-uniformity enhances the performance of the process chamber 100 and the corresponding semiconductor devices. It is contemplated that the shape of the surface 120 may be altered to improve and/or mitigate the plasma non-uniformities.

Further, shaping the surface 120 of the faceplate 118 to include one or more curved regions corrects for plasma non-uniformities for a range of frequencies used in the deposition process. Accordingly, the deposition process speed may be increased while maintaining high quality film performance, as plasma non-uniformities which are conventionally generated when using higher frequencies can be mitigated by the faceplate 118.

During processing, a plasma is formed in the processing volume 108 from a precursor gas mixture provided through the central conduit 138 via gas supply system 140. The plasma may be formed by capacitive means, and may be energized by coupling RF power into the precursor gas mixture via the power supply 142 and the power supply 150. The RF power may be a dual-frequency RF power that has a high frequency component and a low frequency component. The RF power is typically applied at a power level between about 50 W and about 2500 W, which may be all high-frequency RF power, for example at a frequency in a range of about 13 MHz to 60 MHz. Alternatively, the RF power may be a mixture of high-frequency power and low frequency power, for example at a frequency of about 300 kHz. Upon energizing a plasma in the processing volume 108, a potential difference is established between the plasma and the electrode 134 and/or the faceplate 118.

A controller 190 is coupled to the process chamber 100. The controller 190 includes a central processing unit (CPU) 192, a memory 194, and support circuits 196. The controller 190 is utilized to control the operation of the process chamber 100. For example, the controller 190 may control the operation of the gas supply system 140 and/or the power supplies 142, 150 and 152.

The CPU 192 may be of any form of a general purpose computer processor that can be used in an industrial setting. The software routines can be stored in the memory 194, such as random access memory, read only memory, floppy or hard disk drive, or other form of digital storage. The support circuits 196 are coupled to the CPU 192 and may comprise cache, clock circuits, input/output subsystems, power supplies, and the like. The software routines, when executed by the CPU 192, transform the CPU 192 into a specific purpose computer (controller) 190 that controls the process chamber 100 such that the processes are performed in accordance with the present disclosure. The software routines may also be stored and/or executed by a second controller (not shown) that is located remotely from the chamber.

Figure 2:
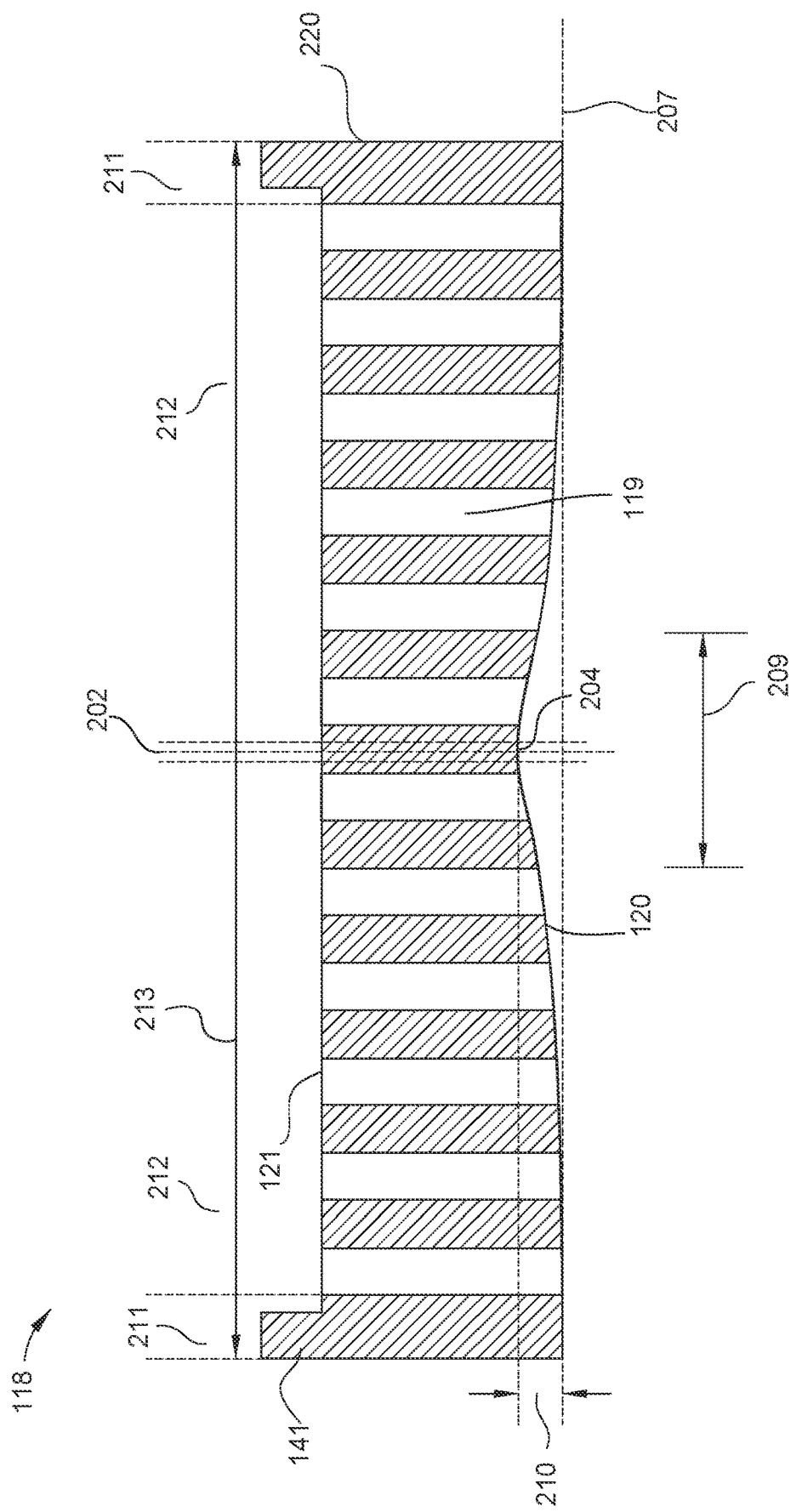
FIGS. 2, 3, 4, and 5 are schematic illustrations of a cross-section of a faceplate, according to various embodiments.

FIG. 2 is a schematic illustration of a cross-section of the faceplate 118. As is described with regard to FIG. 1, the faceplate 118 includes surfaces 120 and 121, where the surface 120 has a curved shape. The faceplate has a width 213. The curved shape is disposed radially inward from the mounting ring 141. As illustrated in FIG. 2, the surface 120 has a Gaussian shape. The Gaussian shape may be described as having a peak 204 with a height (e.g., height 210) having full width (e.g., width 209) at half of the height 210. Varying the height 210 and/or the width 209 of the curved shape varies the effects that the shape of the faceplate 118 has on the uniformity of the plasma generated within the processing volume 108. For example, the height 210 may be increased or decreased to alter the effects that the shape of the faceplate 118 has on the uniformity of the plasma. Additionally, or alternatively, the width 209 may be increased or decreased to alter the effects that the shape of the faceplate 118 has on the uniformity of the plasma. The width 209 is less than the width 213. Alternatively, the width 209 is equal to the width 213.

The Gaussian shape may be referred to as a bell shape. For example, the shape of the surface 120 is a symmetrical curve about center line 202 which bifurcates the faceplate 118. In such an example, the surface 120 is symmetric about any plane formed through an axial centerline of faceplate 118 (e.g., 360 degrees of symmetry). Alternatively, the shape of the surface 120 is not axial symmetric about the center line 202.

The curve of the surface 120 may correspond to a width of the substrate undergoing processing. For example, the width of the curve or shape of the surface 120 may be at least as large as the width of the substrate.

The Gaussian shape of the surface 120 decreases the plasma non-uniformity of the plasma generated within the processing volume 108, decreasing the localized stress non-uniformities of the layers deposited on the substrate 101. Utilizing a faceplate having a Gaussian shaped surface may reduce the localize stress non-uniformities to having IPD values.

The shape of the surface 120 comprises regions 211, 212. The region 211 is proximate the mounting ring 141 and the edge 220 of the faceplate 118 and has a slope of approximately zero. The region 212 has an increasing slope (e.g., a positive slope) toward a center of the faceplate 118. Further, the region 212 is between the region 211 and the peak 204.

The peak 204 has a height 210 referenced to a plane 207, defined as a plane of the most distal end of the faceplate 118. The height 210 may be in a range of about 10 mils to about 20 mils. The height 210 of the peak 204 may correspond to plasma non-uniformity of the plasma generated within the processing volume 108. For example, the height 210 may be increased to compensate for larger amounts of plasma non-uniformities.

Figure 3:
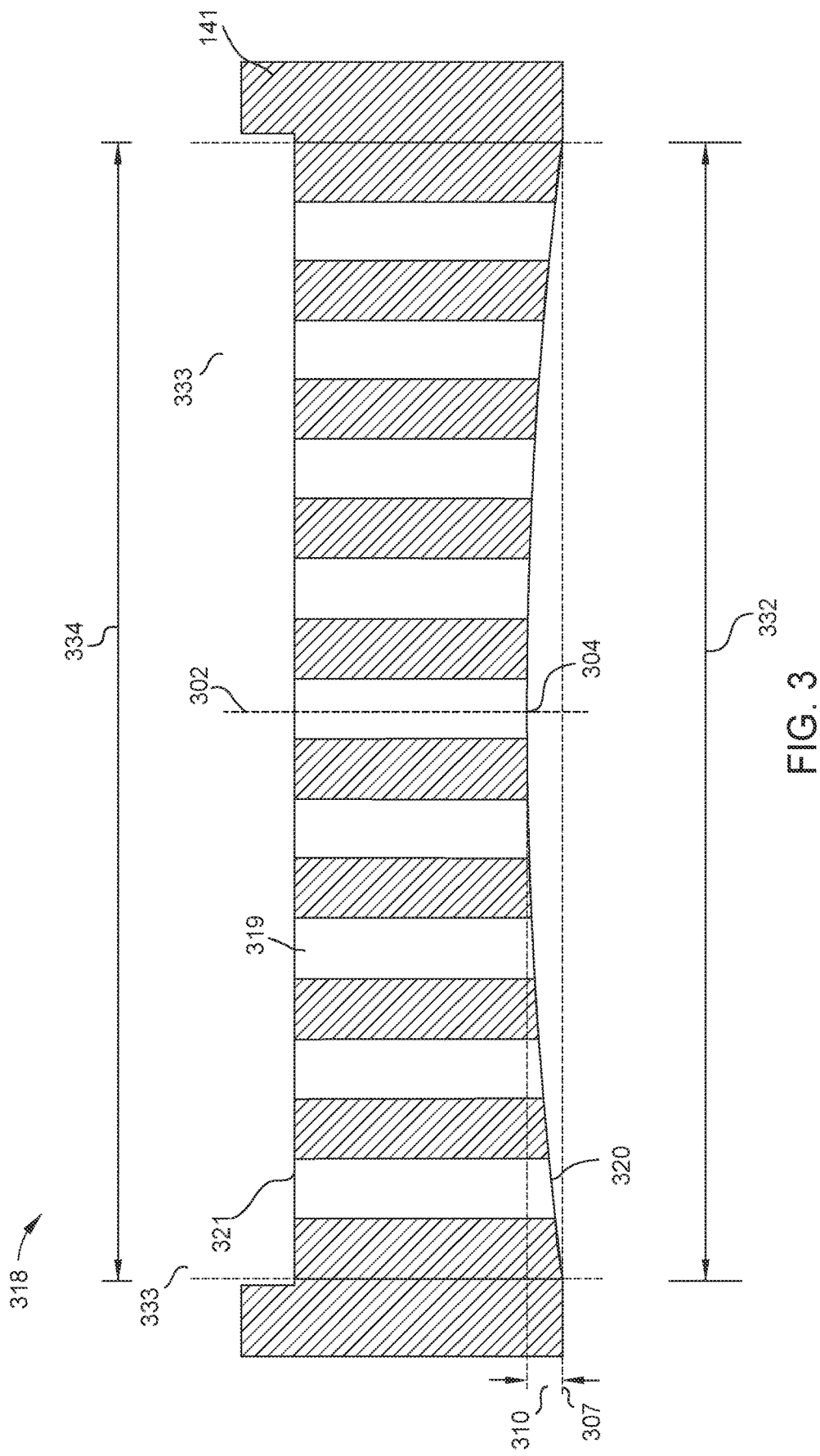

FIG. 3 is a schematic illustration of a cross-section of the faceplate 318. The faceplate 318 may be configured similar to that of faceplate 318; however, the surface 320 has a different shape than the surface 120 of the faceplate 118. For example, the surface 320 has a parabolic shape as compared the Gaussian shape of the surface 120 of the faceplate 318. Further, the faceplate 318 may be used within the process chamber 100 of FIG. 1 as an alternative to the faceplate 318. Additionally, the faceplate 318 includes apertures 319 that may be configured similar to the apertures 119 of the faceplate 318.

A center line 302 bifurcates the faceplate 318 into two equal portions. The parabolic shape of the surface 320 may be axial symmetric about the center line 302. For example, the parabolic shape of the surface 320 is 3D symmetric about the center line 302. Alternatively, the shape of the surface 320 is not axial symmetric about the center line 302. Further, the surface 320 has a peak 304 having a height 310. The height 310 is referenced to a plane 307 of the surface 320 that is the furthest from the surface 321. The height 310 may be in a range of about 10 mils to about 20 mils. Alternatively, the height 310 may be less than about 10 mils or greater than about 20 mils. The parabolic shape of the surface 320 may extend across the entirety of the surface 320 radially inward of the mounting ring 141. For example, the width 332 of the peak 304 is equal to width 334 of the faceplate 118 radially inward and not including the mounting ring 141. Alternatively, the width 332 may be less than the width 334 and the surface 320 may include one or more regions proximate the mounting ring 141 having a slope of approximately zero. The slope of region 333 and/or the height 310 may be varied to vary the effects that the faceplate 118 has on the uniformity of the plasma generated in the processing volume 108. For example, the slope of the region 333 may be increased or decreased to alter how the faceplate 118 affects the uniformity of the plasma. Additionally, or alternatively, the height 310 may be varied to alter how the faceplate 118 affects the uniformity of the plasma.

The parabolic shape of the surface 120 has a region 333 where the slope transitions from an increasing slope (e.g., a positive slope) to a slope of zero proximate the peak 304. The region 333 converges at the peak 304.

Figure 4:
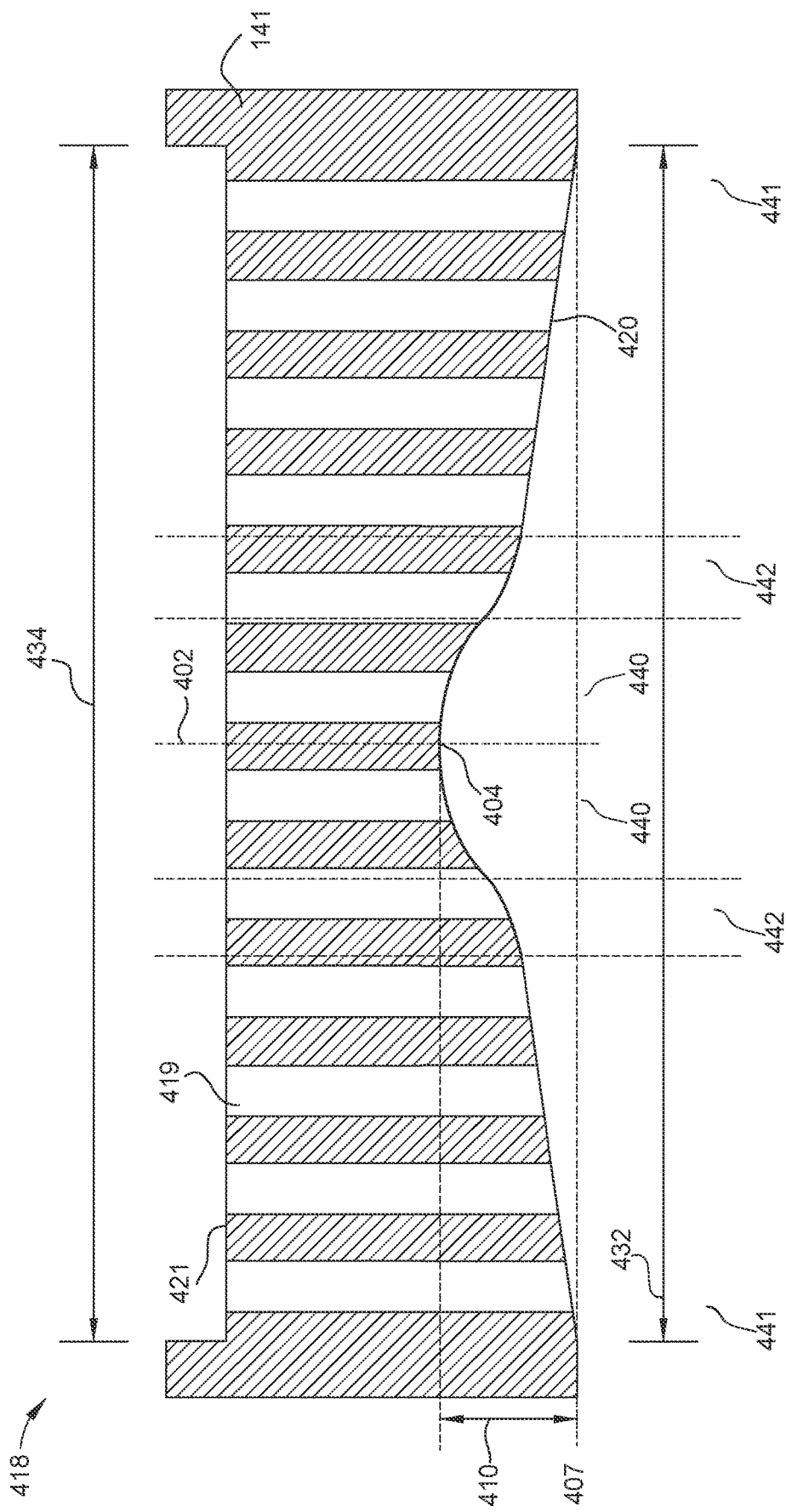

FIG. 4 is a schematic illustration of a cross-section of faceplate 418. The faceplate 418 may be configured similar to that of faceplate 118; however, the surface 420 has a different shape than the surface 120 of the faceplate 118. For example, the surface 420 has a kink shape. A kink shape may be defined as including a combination of different curves with different slopes. For example, the surface 420 includes a first curved region 440, second curved region 442 adjacent the first curved region 440, and a linear region 441 radially outward of the second curved region 442. The first curved region 440 includes a peak 404. Further, the second curved region 442 has a slope which increases towards the peak 404. The region 441 includes an increasing slope towards the curved regions 442. The region 441 meets the region 442. Further, the region 441 may have a substantially constant slope. The slopes of the regions 440, 441, and 442 and the height 410 may be varied to vary the effects that the faceplate 118 has on the uniformity of the plasma generated in the processing volume 108. For example, the slope of the regions 440, 441, and 442 may be increased or decreased to alter how the faceplate 118 affects the uniformity of the plasma. Additionally, or alternatively, the height 410 may be varied to alter how the faceplate 118 affects the uniformity of the plasma.

The faceplate 418 may be used within the process chamber 100 of FIG. 1 as an alternative to the faceplate 118. Further, the faceplate 418 includes apertures 419 that may be configured similar to the apertures 119 of the faceplate 118.

A center line 402 bifurcates the faceplate 418 into two equal portions. The shape of the surface 420 may be axial symmetric about the center line 402. For example, the kink shape of the surface 420 is 3D symmetric about the center line 302. Alternatively, the shape of the surface 420 is not axial symmetric about the center line 402. Further, the peak 404 has a height 410. The height 410 is referenced to a plane 407 of the surface 420 that is the furthest from the surface 421. The height 410 may be in a range of about 10 mils to about 20 mils.

The shape of the surface 420 may extend across the entirety of the surface 420 radially inward from the mounting ring 141. For example, the combined width 432 of the linear region 441, and the regions 440, 442 may be equal to width 434 of the faceplate 418 not including the mounting ring 141. Alternatively, the width 432 may be less than the width 434 and the surface 320 may include one or more regions having a slope of approximately zero.

Figure 5:
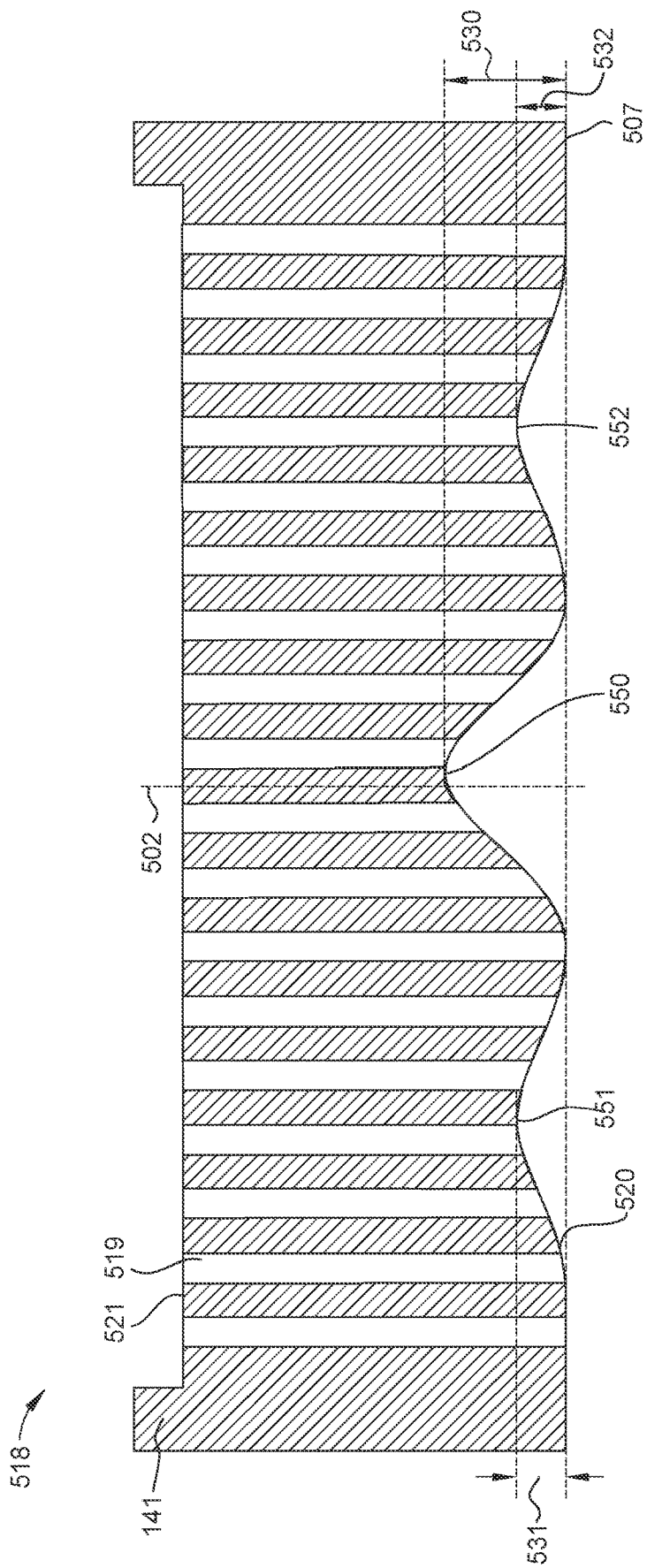

FIG. 5 is a schematic illustration of a cross-section of the faceplate 518. The faceplate 518 may be configured similar to that of faceplate 118. However, the faceplate 518 has a surface 520 with multiple peaks (e.g., peaks 550, 551, 552). The surface 520 is curved and may be referred to as has having an angulated shape. The faceplate 518 may be used within the process chamber 100 of FIG. 1 as an alternative to the faceplate 118. The faceplate 518 includes apertures 519 that may be configured similar to the apertures 119 of the faceplate 118.

While three peaks are illustrated in FIG. 5, alternatively, the faceplate 518 may have two or more peaks. For example, the faceplate 518 may have more than the three peaks illustrated. Further, each of the peaks 550, 551, 552 may have a common shape. For example, each of the peaks 550, 551, 552 may have one of a Gaussian shape, a parabolic shape, and a kink shape, among others. Further, additional curved shapes may be utilized. Alternatively, a first one or more of the peaks 550, 551, 552 may have a shape different from the shape of a second one or more of the peaks 550, 551, 552. Further, one or more of the peaks 550, 551, 552 may have a height that is larger than that of another one or more of the peaks 550, 551, 552. For example, the height 530 may be greater than the height 531 and the height 532. Additionally, the height 531 may be equal to the height 532. The heights 530, 531 and 532 are referenced to a plane 507 of the surface 520 that is the furthest distance from the surface 521.

The location and number of peaks 550, 551, 552 may correspond to the non-uniformity of the plasma generated within the processing volume 108. For example, a peak may be positioned such the peak corresponds to a plasma non-uniformity generated in the processing volume 108. Further, the height of the peaks 550, 551, 552 may correspond to level of plasma non-uniformity. For example, for higher levels of plasma non-uniformity, peaks have a greater height may utilized.

Center line 502 bifurcates the faceplate 518 into two equal portions. The surface 520 may be shaped such that the surface 520 is axial symmetric about the center line 502 (e.g., 3D symmetric about the center line 502). Alternatively, the surface 520 may be shaped such that the surface 520 is not axial symmetric about the center line 502. The center of the peak 550 is aligned with the center line 502. Alternatively, the center of the peak 550 is unaligned with the center line 502.

The IPD within layers deposited on a substrate may be decreased by decreasing the plasma non-uniformity. For example, shaping the surface of the faceplate facing a processing volume of a process chamber to include one or more curved regions decreases the plasma non-uniformity. Decreasing the plasma non-uniformity reduces the IPD of each layer deposited on a substrate reducing the production failure rate of corresponding semiconductor devices. Further, the use of a shaped faceplate allows for the use of RF powers having frequencies above 13 MHz during the deposition process.

While the foregoing is directed to embodiments of the present disclosure, other and further embodiments of the disclosure may be devised without departing from the basic scope thereof, and the scope thereof is determined by the claims that follow.

What is claimed is:

1. A faceplate for a process chamber, the faceplate comprising:
   a circular mounting ring configured to mount the faceplate within the process chamber;
   a first surface;
   a second surface opposite the first surface, the second surface configured to be exposed to a processing volume of the process chamber, the second surface including a first curved region having a first peak centered at and symmetric with respect to a vertical centerline of the faceplate; and
   a plurality of apertures comprising first and second apertures extending through the faceplate from the first surface to the first curved region of the second surface, wherein the first curved region has an increasing slope converging at the first peak, and the second apertures are radially outward of the first apertures with respect to the vertical centerline of the faceplate.

2. The faceplate of claim 1, wherein the faceplate comprises a conductive material.

3. The faceplate of claim 1, wherein the second surface further includes:

a second curved region adjacent to the first curved region; and a linear region radially outward of the second curved region, wherein the second curved region has a slope increasing towards the first peak, and the linear region has a positive slope.

4. The faceplate of claim 3, wherein the linear region extends across the entirety of the second surface radially inward from the circular mounting ring.

5. The faceplate of claim 1, wherein a height of the first peak is in a range of 10 mils to 20 mils.

6. The faceplate of claim 1, wherein a shape of the second surface is axial symmetric about vertical centerline of the faceplate.

7. A faceplate for a process chamber, the faceplate comprising:

a circular mounting ring configured to mount the faceplate within the process chamber;

a first surface;

a second surface opposite the first surface, the second surface configured to be exposed to a processing volume of the process chamber, the second surface including a first curved region having a first peak at a vertical centerline of the faceplate, and one or more second curved regions each having a second peak radially outward of the first peak;

a plurality of apertures comprising:

first and second apertures extending through the faceplate from the first surface to the first curved region of the second surface, wherein the second apertures are radially outward of the first apertures; and third and fourth apertures extending through the faceplate from the first surface to each of the one or more second curved regions of the second surface, wherein the fourth apertures are radially outward of the third apertures.

8. The faceplate of claim 7, wherein the faceplate comprises a conductive material.

9. The faceplate of claim 7, wherein the first peak is centered at and symmetric with respect to the vertical centerline of the faceplate.

10. The faceplate of claim 7, wherein the first peak has an increasing slope towards the center of the first peak.

11. The faceplate of claim 7, wherein a height of the first peak is in a range of 10 mils to 20 mils.

12. The faceplate of claim 7, wherein a height of the first peak is larger than a height of the second peaks.

13. The faceplate of claim 7, wherein a shape of the second surface is axial symmetric about vertical centerline of the faceplate.

14. A faceplate for a process chamber, the faceplate comprising:

a circular mounting ring configured to mount the faceplate within the process chamber;

a first surface;

a second surface opposite the first surface, the second surface configured to be exposed to a processing volume of the process chamber, the second surface including a first curved region having a first peak centered at and symmetric with respect to a vertical centerline of the faceplate; and a plurality of apertures comprising first and second apertures extending through the faceplate from the first surface to the first curved region of the second surface, wherein the first curved region has an increasing slope converging at the first peak, and the second apertures are radially outward of the first apertures with respect to the vertical centerline of the faceplate.

15. The faceplate of claim 14, wherein the faceplate comprises a conductive material.

16. The faceplate of claim 14, wherein a height of the first peak is in a range of 10 mils to 20 mils.

* * * * *